United States Patent [19]

Murotani

[11] Patent Number: 4,553,045
[45] Date of Patent: Nov. 12, 1985

[54] LOGIC CIRCUIT WITH IMPROVED HYSTERESIS CHARACTERISTICS

[75] Inventor: Tatsunori Murotani, Tokyo, Japan

[73] Assignee: Nippon Electric Co., Ltd., Tokyo, Japan

[21] Appl. No.: 465,392

[22] Filed: Feb. 10, 1983

[30] Foreign Application Priority Data

Feb. 10, 1982 [JP] Japan .................................. 57-19914

[51] Int. Cl.$^4$ .................... H03K 3/356; H03K 19/094
[52] U.S. Cl. .................................... 307/279; 307/443; 307/548; 307/577; 307/290
[58] Field of Search ............... 307/443, 448, 450, 548, 307/550, 577, 573–575, 581, 272 R, 279, 290

[56] References Cited

U.S. PATENT DOCUMENTS

| | | | |
|---|---|---|---|
| 4,071,784 | 1/1978 | Maeder et al. | 307/279 |
| 4,080,539 | 3/1978 | Stewart | 307/279 X |
| 4,097,772 | 6/1978 | Carter | 307/574 X |
| 4,268,764 | 5/1981 | Eckert | 307/290 X |

Primary Examiner—Stanley D. Miller
Assistant Examiner—D. R. Hudspeth
Attorney, Agent, or Firm—Sughrue, Mion, Zinn, Macpeak & Seas

[57] ABSTRACT

A logic circuit provided with a desired hysteresis characteristic in its input-output characteristics is disclosed. The circuit comprises a logic section including a first depletion type field effect transistor operating as a load element and at least one input field effect transistor of an enhancement type, a series circuit of a second depletion type field effect transistor and a switching transistor connected in series with respect to the first depletion type field effect transistor and means responsive to an output signal of the logic section for controlling the switching transistor so as to provide a hysteresis in the input-output characteristic of the circuit.

12 Claims, 8 Drawing Figures

LOGIC CIRCUIT WITH IMPROVED HYSTERESIS CHARACTERISTICS

BACKGROUND OF THE INVENTION

The present invention relates to a logic circuit employing field effect transistors, and more particularly to an E/D type logic circuit whose input-output characteristics have a hysteresis.

The E/D type logic circuit comprises a depletion type field effect transistor used as a load transistor and an enhancement type field effect transistor provided as a signal input transistor or a driving transistor, and can derive as a high level output almost a power supply level without level reduction. Therefore, it has high utilization efficiency of a power supply voltage. Further, a high speed operation is achieved, because the depletion type load transistor has a fast rise of a current fed therethrough in response to its gate voltage. It is necessary in a logic circuit that an output signal changes abruptly when an input signal exceeds a threshold value of the logic circuit, and a noise margin should be large so that once an output state has been established, it is not changed by a minute potential change in the input signal which is caused by noise or the like. In order to make this noise margin large, it has been commonly practiced to provide the input-output characteristics of a logic circuit with a hysteresis.

Let us consider an inverter circuit as a simplified example of the logic circuit having a hysteresis characteristic. The inverter circuit has a depletion type MOS transistor as a load and a driving MOS transistor of an enhancement type connected in series with the load transistor. In order to give a hysteresis characteristic to the inverter circuit, an enhancement-type feedback transistor is connected in parallel to the driving transistor, with a signal produced by inverting an output signal of the inverter being applied to the gate of the feedback transistor.

In a semiconductor integrated circuit having a plurality of MOS transistors, a relative error in characteristics of transistors formed on the same semiconductor substrate through the same process is in general, very small. However, even among transistors formed according to the same design specification, those formed through different processes and those formed on different semiconductor substrates though through the same process, would be associated with a large relative error in characteristics.

For the foregoing reason, the above-described inverter circuit having a hysteresis characteristic, when formed as a semiconductor integrated circuit, cannot have a predetermined relation in characteristics, just as designed, between the enhancement-type driving transistor and the depletion type load transistor, because the enhancement type transistor and the depletion type transistor are formed through different process.

Consequently, the hysteresis characteristic has been also influenced by the fluctuations in the characteristics among the transistors, especially between the depletion type transistor and the enhancement type transistor, and hence it has been difficult to obtain a logic circuit having a desired hysteresis characteristic.

SUMMARY OF THE INVENTION

It is therefore an object of the present invention to provide a logic circuit having a hysteresis characteristic that is minimally influenced by fluctuations in the characteristics of transistors.

Another object of the present invention is to provide a logic circuit having desired input-output characteristics that may be realized as a semiconductor integrated circuit.

The logic circuit according to the present invention is characterized by comprising a first series circuit connected between power supply terminals and including a first depletion type field effect transistor operating as a load transistor and a first enhancement type field effect transistor operating as a driving transistor, a second series circuit connected between an intermediate junction of the first series circuit and one of the power supply terminals and including a second depletion type field effect transistor operating as a constant current source and a second enhancement type field effect transistor as a switching transistor, and means responsive to the potential at the intermediate junction of the first series circuit for controlling the second series circuit so that the second series circuit may achieve positive feedback to the intermediate junction.

According to the present invention, the second series circuit providing a positive feedback path to give the first series circuit a hysteresis characteristic is constructed as an E/D structure similarly to the first series circuit operating as a logic section. Therefore, the relativity between the enhancement type transistors in the first and second series circuits and between the depletion type transistors in the first and second series circuits are respectively secured even if the relativity in characteristics between the enhancement type transistor and the depletion type transistor fluctuates or cannot be realized as desired. Consequently, the relativity between the first series circuit and the second series circuit can be realized. In this way, according to the present invention, a logic circuit having desired input-output characteristics can be easily realized.

According to the present invention, there is provided an E/D type inverter circuit which comprises a first depletion type MOS transistor used as a load, a first enhancement type MOS transistor used as a driving transistor to produce inverter output, a second enhancement type MOS transistor whose source and drain are connected to an output terminal of the inverter, and a second enhancement type MOS transistor driven by an inverted signal of the inverter output, the other of the source and drain of the second enhancement type MOS transistor being grounded via the second depletion type MOS transistor.

The logic circuit according to the present invention can be effectively utilized as an address inverter in a memory or as an input inverter of a multi-input logic circuit.

DETAILED DESCRIPTION OF THE PRIOR ART

Before providing a description of the preferred embodiments of the present invention, the inverter circuit having a hysteresis characteristic in the prior art will be described in more detail with reference to the accompanying drawings.

In the following description, an N-channel MOS transistor is employed as an insulated gate field effect transistor, and a positive logic in which a high level represents logic "1" and a low level represents logic "0", is employed. As a matter of course, even if a P-channel field effect transistor is employed or a negative logic is employed, no change would occur in the basic circuit construction.

Figure 1:
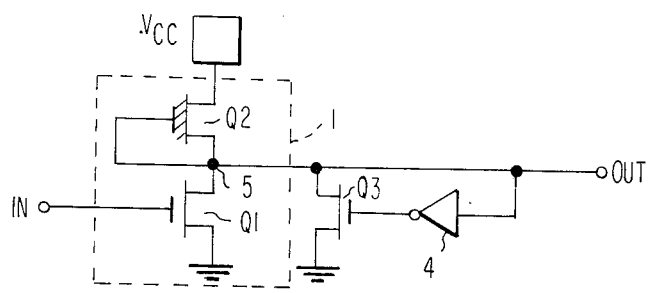
FIG. 1 is a circuit diagram of an inverter circuit having a hysteresis characteristic in the prior art.

The simplest example of an E/D type inverter having a hysteresis characteristic in which a depletion type MOS transistor is used as a load and an enhancement type MOS transistor is used as a driving transistor, is illustrated in FIG. 1.

The circuit shown in FIG. 1 comprises a logic section 1 in which an enhancement type MOS transistor (hereinafter abbreviated as E MOST) $Q_1$ is connected between an output node 5 and the ground as a driving transistor for receiving a signal at an input terminal IN and a depletion type MOS transistor $Q_2$ having its gate connected to the output node 5 is included as a load transistor, an E MOST $Q_3$ connected in parallel to the E MOST $Q_1$, and an inverter 4 having its input connected to the output node 5 and its output connected to the gate of the E MOST $Q_3$. In this example, a hysteresis characteristic is generated by driving the E MOST $Q_3$ by an output signal of the inverter 4, that is, by an inverted signal of the output of the logic section 1.

Figure 2:
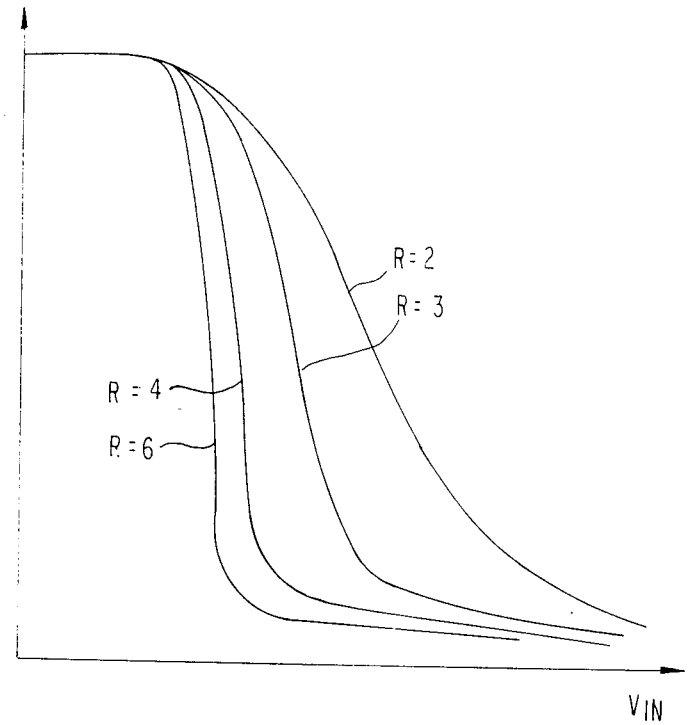
FIG. 2 shows transmission characteristics of inverters in the case a conductivity ratio of a load transistor versus a driving transistor is varied.

The input-output characteristics of the logic section 1 consisting of the E MOST $Q_1$ and the D MOST $Q_2$ per se in the case where the E MOST $Q_3$ and the inverter 4 are not present, are shown in FIG. 2 with respect to the relation between the voltage $V_{IN}$ at the input terminal IN and the voltage $V_{OUT}$ at the output terminal OUT.

In FIG. 2, the input-output characteristics of the logic section 1 are represented as a parameter by way of a ratio $R = DQ_1/DQ_2$ of a driving capability $DQ_1$ of the E MOST $Q_1$ versus a driving capability $DQ_2$ of the D MOST $Q_2$. As will be apparent from FIG. 2, as the ratio R becomes larger, the decrease of the output voltage $V_{OUT}$ in response to the increase of the input voltage $V_{IN}$ occurs more abruptly. On the other hand, as the ratio R is reduced, the variation of the output voltage $V_{OUT}$ in response to a variation of the input voltage becomes gradual.

Here it is to be noted that as is generally known, the driving capability $DQ_1$ of the E MOST $Q_1$ and the driving capability $DQ_2$ of the D MOST $Q_2$ are proportional to a square of a difference between the gate-source voltage $V_{GS}$ of each transistor and a threshold value $V_T$ of the transistor, i.e. $(V_{GS}-V_T)^2$, and also it is proportional to a mutual conductance $G_m$ (a current amplification factor) that is inherently possessed by each transistor.

Figure 3:
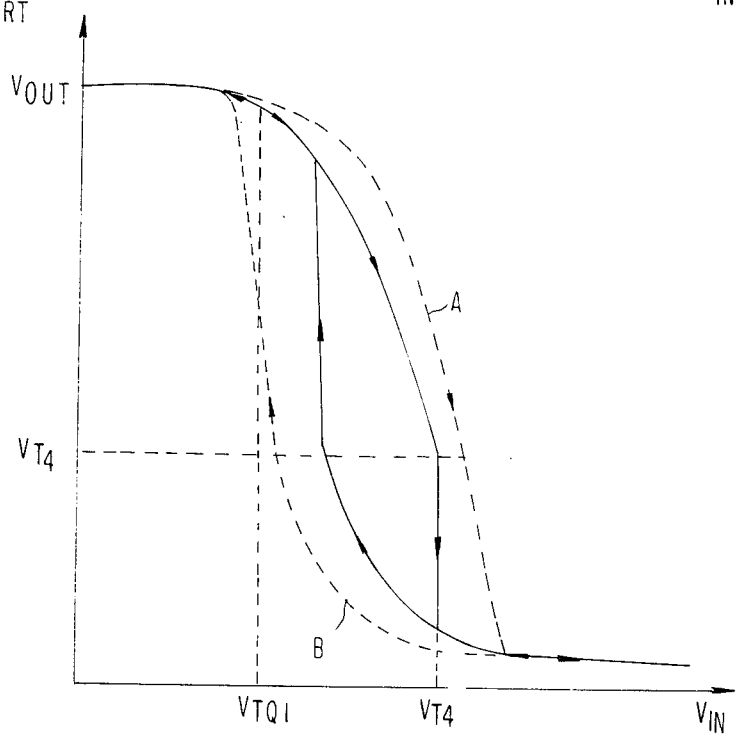
FIG. 3 shows input-output transmission characteristic of the circuit shown in FIG. 1.

Now the operation of the inverter having a hysteresis characteristic provided with the E MOST $Q_3$ and the inverter 4 shown in FIG. 1, will be explained with reference to FIG. 3.

When the input $V_{IN}$ is at a level lower than a threshold voltage $V_{TQ1}$ of the E MOST $Q_1$, the E MOST's $Q_1$ and $Q_3$ are both OFF, and hence the voltage $V_{OUT}$ at the node 5 is at a high level. When $V_{IN}$ exceeds the threshold voltage $V_{TQ1}$, the E MOST $Q_1$ is turned ON, and the voltage $V_{OUT}$ begins to fall. As the input voltage $V_{IN}$ rises further and when the voltage $V_{OUT}$ becomes lower than the threshold voltage $V_{14}$ of the inverter 4, the E MOST $Q_3$ which has been OFF now is turned ON, hence the voltage at the node 5 begins to fall abruptly, and the output of the inverter goes to a low level. In the event that the input voltage $V_{IN}$ varies from a high level to a low level, then the output voltage $V_{OUT}$ rises gradually, and since the E MOST $Q_3$ is ON while the output voltage $V_{OUT}$ does not exceed the threshold $V_{T4}$ of the inverter 4, the output voltage $V_{OUT}$ hardly reaches a high level. At the time point when the output voltage $V_{OUT}$ has exceeded the threshold, it abruptly reaches a high level. Summarizing the above explanation, it can be concluded that in the case where the input voltage rises, only the E MOST $Q_1$ operates as a driving transistor, whereas in the case of lowering both the E MOST's $Q_1$ and $Q_3$ operate as driving transistors, and hence the difference, that is, the driving capability of the E MOST $Q_3$ produces a hysteresis characteristic.

In general, MOS transistors have a large fluctuation in characteristics such as a threshold voltage and a current amplification factor, ($G_m$) and in the case of employing two types of, that is an enhancement type and a depletion type of transistors, the respective types of transistors have fluctuations independently of each other, and therefore, the fluctuation in characteristics of the E/D type inverter would become considerably large. Consequently, with a hysteresis circuit as used in the prior art inverter, the hysteresis characteristic of the inverter was liable to be influenced by the fluctuation of the transistor characteristics, and hence optimum design was difficult.

For instance, if the threshold $V_T$ of the D MOST $Q_2$ is lowered or its $G_m$ becomes large, the falling curve of the output voltage $V_{OUT}$ would change as shown by a dash line curve A. On the other hand, if the threshold $V_T$ of the E MOST's $Q_1$ and $Q_3$ becomes small and their $G_m$ becomes large, the rising curve of the output voltage $V_{OUT}$ would be deviated as shown by a dash line curve B. Accordingly, it was difficult to obtain a desired hysteresis characteristic.

DETAILED DESCRIPTION OF PREFERRED EMBODIMENTS

Now the present invention will be described in greater detail in connection to its preferred embodiments.

Figure 4:
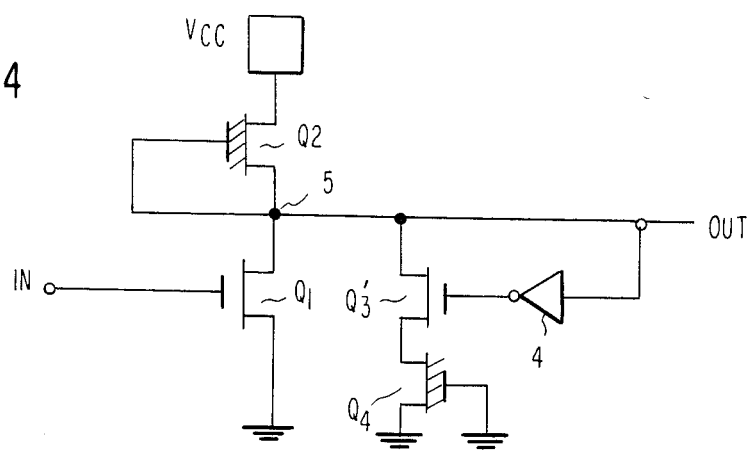
FIG. 4 is a circuit diagram of a first preferred embodiment of the present invention.
Figure 5:
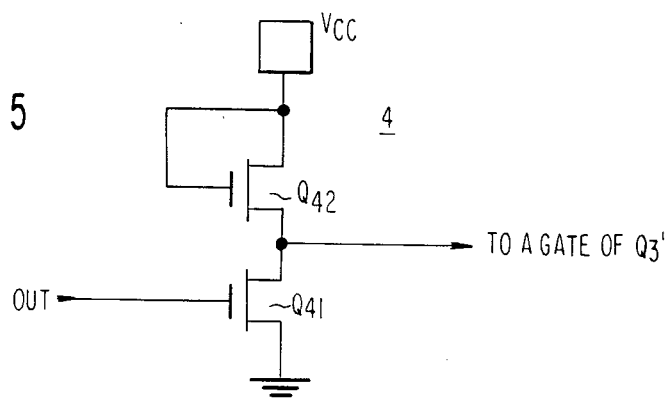
FIG. 5 shows a circuit diagram showing an example of the inverter employed in the circuit of FIG. 4.

A first preferred embodiment will be described with reference FIG. 4. This embodiment is constructed by employing a series circuit of an E MOST $Q_3'$ and a D MOST $Q_4$ in place of the feedback control E MOST $Q_3$ in FIG. 1. More particularly, between a power supply terminal $V_{cc}$ and a node 5 is connected a D MOST $Q_2$ serving as a load transistor, while between the node 5 and the ground is connected an E MOST $Q_1$ whose gate is connected to an input terminal IN, and thereby a logic section is formed. A circuit for realizing a hysteresis characteristic is formed by an E MOST $Q_3'$ having either its source and drain connected to the node 5, a D MOST $Q_4$ connected between the other of the source and drain of the E MOST $Q_3$ which is not connected to node 5 and the ground and having its gate grounded, and an inverter 4 having its input connected to the node 5 and its output connected to the gate of the E MOST $Q_3'$. A gate of the D MOST $Q_4$ is connected to its source or drain so as to operate as a constant current source. Here, threshold voltages of E MOST $Q_1$ and $Q_3'$ are the same and threshold voltage of D MOSTs $Q_2$ and $Q_4$ are the same. In this structure, on the same semiconductor substrate the E MOST's $Q_1$ and $Q_3'$ are formed by the same process, and the D MOST's $Q_2$ and $Q_{42}$ are formed by the same process. The inverter 4 has a circuit structure shown in FIG. 5 in which E MOST $Q_{41}$ receiving a signal from the terminal OUT at its gate and a load E MOST $Q_{42}$ are connected in series between the terminal $V_{cc}$ and the ground. Accordingly, a relativity between the respective E MOST's and a relativity between the respective D MOST's can be assured. Accordingly, the driving capability ratio of the series circuit consisting of the E MOST $Q_3'$ and the D MOST $Q_4$ to the D MOST $Q_2$ serving as a load transistor, can be easily maintained at a desired value.

In other words, assuming that the characteristics of the E MOST $Q_1$ are constant, if the characteristics of the D MOST $Q_2$ serving as a load transistor should fluctuate in the direction of a higher capability, then the hysteresis characteristic becomes large, and in the contrary case it becomes small. In the illustrated embodiment, since the D MOST $Q_4$ is connected in series with the E MOST $Q_3'$, the capability of the driving side ($Q_4$, $Q_3'$) which operates in response to a feedback signal also varies in proportion to the capability of the load side ($Q_2$), so that the capability ratio of the load side to the driving side can be maintained constant, and thereby the influence of the variation of characteristics of the depletion transistors can be made small.

Figure 6:
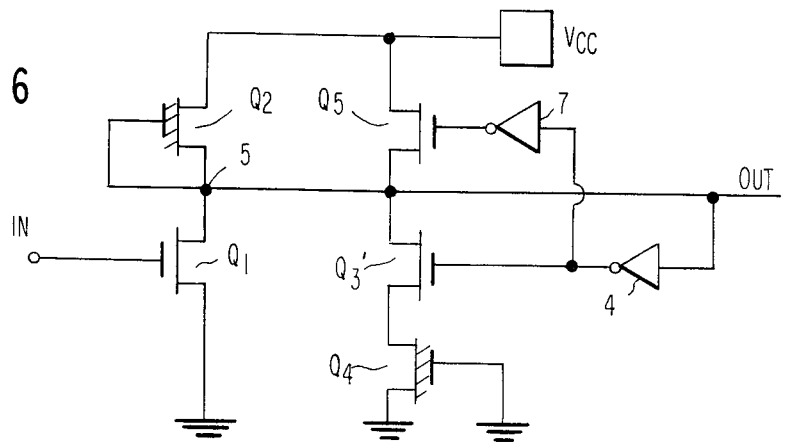
FIGS. 6 through 8 are circuit diagrams of second to fourth preferred embodiments of the present invention.

Now, a second preferred embodiment of the present invention will be described with reference to FIG. 6. In this preferred embodiment, an E MOST $Q_5$ connected between the power supply terminal $V_{cc}$ and the node 5 is further added to the preferred embodiment shown in FIG. 4, and this E MOST $Q_5$ is driven by an inverter 7 whose input is connected to the output of the inverter 4. The function of the E MOST $Q_5$ is that the capability of the load side is compensated in response to fluctuations in the characteristics of the driving side E MOST $Q_1$ according to the same principle as the D MOST $Q_4$ in the first preferred embodiment, and thereby the influence of the characteristics various among the E MOST's can be removed.

Figure 7:
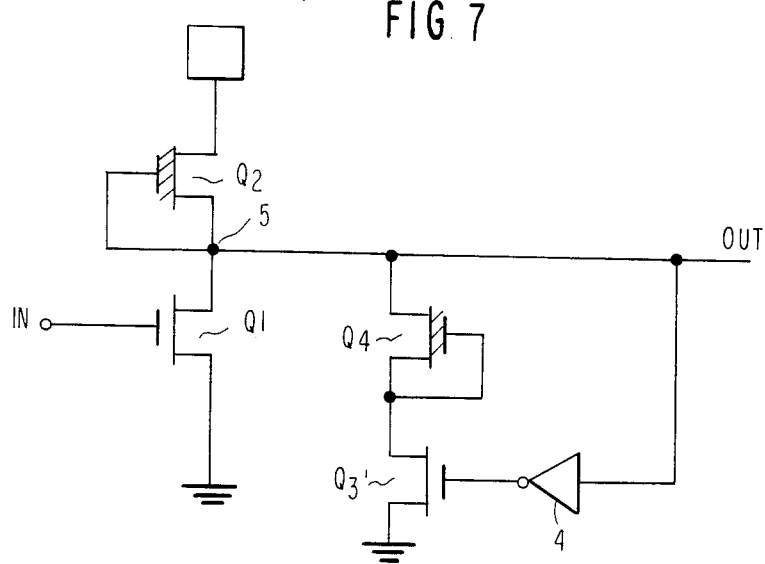

A third preferred embodiment of the present invention will be described with reference to FIG. 7. This embodiment is formed by interchanging the sequence of connection of the D MOST $Q_4$ and the E MOST $Q_3$ in the preferred embodiment shown in FIG. 4. More particularly, either the source and drain of the D MOST $Q_4$ is connected to the node 5 and its gate is connected to the other of the source and drain which is not connected to node 5. E MOST $Q_3'$ is connected between the other of the source and drain of the D MOST $Q_4$ and the ground and its gate is connected to an output of an inverter 4. In this preferred embodiment also, a relativity of a driving capability of the series circuit consisting the D MOST $Q_4$ and the E MOST $Q_3'$ to the D MOST $Q_2$ can be assured, and therefore, a desired hysteresis characteristic can be obtained.

Figure 8:
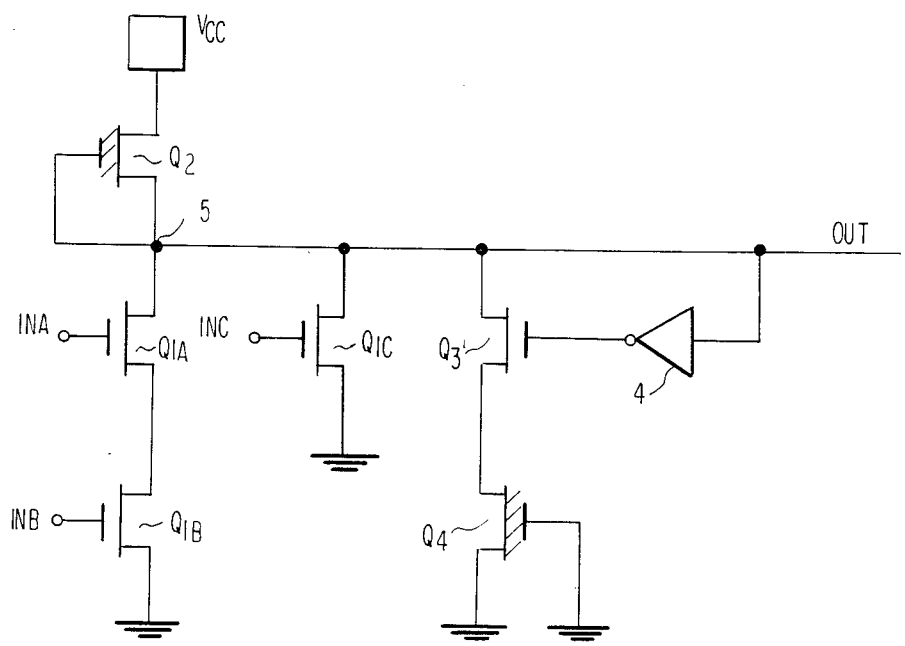

A fourth preferred embodiment of the present invention is illustrated in FIG. 8. This embodiment is constructed by replacing the E MOST $Q_1$ as a driving transistor in FIG. 4, with EMOSTs $Q_{1A}$, $Q_{1B}$ and $Q_{1C}$ forming multi-inputs logic function. Namely, multi-input logic INA·INB+INC is produced by E MOSTs $Q_{1A}$, $Q_{1B}$ and $Q_{1C}$. In this embodiment also, an excellent hysteresis characteristic can be obtained similarly to the above-described embodiments.

As described above, according to the present invention, an inverter having a hysteresis characteristic that is minimally influenced by fluctuations in the characteristics of transistors, can be constructed.

It is to be noted that the present invention is not limited to an inverter, but it is quite equally applicable to the case where any arbitrary multi-input logic circuit such as NOR, NAND, etc. is used as the logic section, for instance, by replacing a plurality of driving E MOST's for the E MOST $Q_1$.

I claim:

1. A logic circuit comprising a first terminal to which a first potential is applied, a second terminal to which a second potential is applied, an output terminal, a first field effect transistor of an enhancement type whose drain-source path is connected in series between said output terminal and said second terminal, means for receiving an input signal, means for supplying a gate of said first transistor with said input signal, a second field effect transistor of a depletion type whose drain source path is connected in series between said first terminal and said output terminal said second transistor having its gate connected to provide operation as a load element, a series circuit of a third field effect transistor of an enhancement type and a fourth field effect transistor of a depletion type connected directly to said output terminal at its one end and to said second terminal at its other end, inverting means responsive to a signal at said output terminal for generating an inverted signal having an opposite phase to the signal at said output terminal, and means for supplying a gate of said third transistor with said inverted signal.

2. The circuit according to claim 1, further comprising a fifth field effect transistor of an enhancement type whose drain-source path is connected between said first terminal and said output terminal, means for generating a control signal having the same phase as that of the signal at said output terminal, and means for supplying a gate of said fifth transistor with said control signal.

3. The circuit according to claim 1, in which said first to fourth transistors are formed on the same semiconductor substrate.

4. A circuit comprising means for receiving at least one input signal, a first terminal to which a first potential is applied, a second terminal to which a second potential is applied, an output node, a load section coupled between said first terminal and said output node for providing an electrical path therebetween, said load section including a first depletion type field effect transistor, a logic section coupled between said output node and said second terminal and operatively generating an electrical path therebetween in response to said at least one input signal, and a feed back section directly coupled to said output node and said second terminal for providing a hysteresis in characteristic between said at least one input signal and a potential at said output node, said feed back section including a second depletion type field effect transistor having a gate connected to one of source and drain thereof and a drain-source current path connected in series between said output node and said second terminal.

5. The circuit according to claim 4, in which said logic section includes at least one input field effect transistor of an enhancement type.

6. The circuit according to claim 4, in which said feed back section includes a switching field effect transistor of an enhancement type connected in series with respect to said second depletion type field effect transistor and an inverter circuit having an input terminal coupled to said output node and an output terminal coupled to a gate of said switching field effect transistor.

7. The circuit according to claim 4, in which said first and second depletion type field effect transistors are formed on the same semiconductor substrate.

8. A logic circuit comprising a first terminal to which a first potential is applied, a second terminal to which a second potential is applied, an output terminal, a first field effect transistor of an enhancement type whose drain-source path is connected in series between said output terminal and said second terminal, means for receiving an input signal, means for supplying a gate of said first transistor with said input signal, a second field effect transistor of a depletion type whose drain-source path is connected in series between said first terminal and said output terminal, said second transistor having its gate connected to provide operation as a load element, a series circuit of a third field effect transistor of an enhancement type and a fourth field effect transistor of a depletion type connected in series between said output terminal and said second terminal, inverting means responsive to a signal at said output terminal for generating an inverted signal having an opposite phase to the signal at said output terminal, means for supplying a gate of said third transistor with said inverted signal, a fifth field effect transistor of an enhancement type whose drain-source path is connected between said first terminal and said output terminal, means for generating a control signal having the same phase as that of the signal at said output terminal, and means for supplying a gate of said fifth transistor with said control signal.

9. The circuit according to claim 8, wherein said first to fifth transistors are formed on the same semiconductor chip.

10. A logic circuit comprising a data generation circuit having a data input transistor of an enhancement type and a load transistor of a depletion type, said data input transistor and said load transistor being connected in series at an output terminal; a first feed back circuit including a first field effect transistor of an enhancement type and a second field effect transistor of a depletion type, said first and second transistors being connected in series between said output terminal and a reference potential, and first means for supplying a gate of said first transistor with a signal having opposite phase to that at said output terminal; and a second feed back circuit including a third field effect transistor of an enhancement type connected in parallel with said load transistor and second means for supplying a gate of said third transistor with a signal of the same phase as that at said output terminal.

11. The circuit according to claim 10, wherein said first means includes a first inverter having an input end coupled to said output terminal and an output end coupled to said gate of said first transistor.

12. The circuit according to claim 11, wherein said second means includes a second inverter circuit having an input end coupled to the input end of said first inverter circuit and an output end coupled to the gate of said third transistor.

* * * * *